(12) United States Patent  
Jean-Mistral

(10) Patent No.: US 8,669,692 B2
(45) Date of Patent: Mar. 11, 2014

(54) PRESSURE POWER RECOVERY DEVICE

(75) Inventor: Claire Jean-Mistral, Grenoble (FR)

(73) Assignee: Commissariat a l'Energie Atomique et aux Energies Alternatives, Paris (FR)

(*) Notice: Subject to any disclaimer, the term of this patent is extended or adjusted under 35 U.S.C. 154(b) by 138 days.

(21) Appl. No.: 13/248,681

(22) Filed: Sep. 29, 2011

(65) Prior Publication Data
US 2012/0074815 A1   Mar. 29, 2012

(30) Foreign Application Priority Data

Sep. 29, 2010 (FR) ...................................... 10 57867

(51) Int. Cl.
*H01L 41/08* (2006.01)
(52) U.S. Cl.
USPC .......................................... 310/339; 310/800
(58) Field of Classification Search
USPC ............................ 310/311, 800, 328, 339, 324
IPC ....................................................... H01L 41/08
See application file for complete search history.

(56) References Cited

U.S. PATENT DOCUMENTS

| 6,768,246 B2* | 7/2004 | Pelrine et al. ................. 310/339 |
| 2001/0035723 A1* | 11/2001 | Pelrine et al. ................. 318/116 |
| 2007/0170822 A1* | 7/2007 | Pei et al. ....................... 310/800 |
| 2010/0079037 A1* | 4/2010 | Jean-Mistral et al. ........ 310/348 |

FOREIGN PATENT DOCUMENTS

| WO | 01/65615 A2 | 9/2001 |
| WO | 02/29965 A1 | 4/2002 |
| WO | 2010148312 A2 | 12/2010 |

OTHER PUBLICATIONS

French Search Report; French Application No. 10/57867; dated May 25, 2011.
European Search Report issued on Oct. 27, 2011 in Application EP011183275.

* cited by examiner

*Primary Examiner* — Thomas Dougherty
*Assistant Examiner* — Karen B Addison
(74) *Attorney, Agent, or Firm* — Vedder Price PC

(57) ABSTRACT

A power recovery device, including an electroactive polymer membrane; an actuator capable of moving along a first direction non-parallel to the mid-plane of the membrane; a member for converting the motion of the actuator into a stretching of the membrane along at least one second direction of the mid-plane of the membrane; and means for biasing the membrane including an electret.

9 Claims, 4 Drawing Sheets

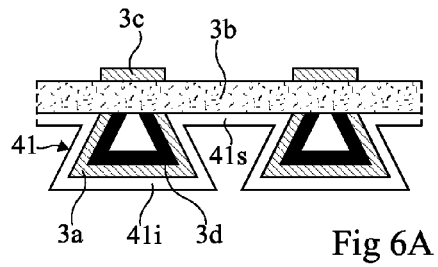 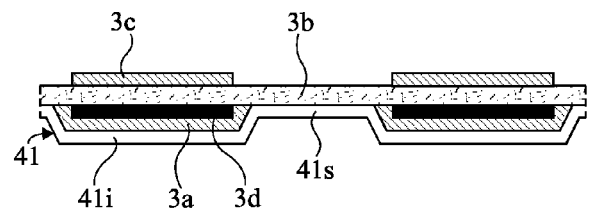
Fig 6A  Fig 6B
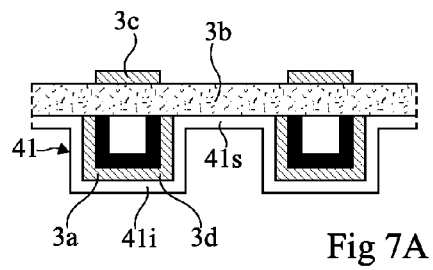 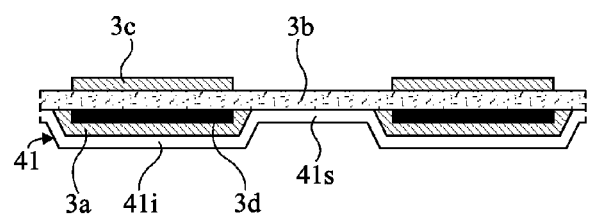
Fig 7A  Fig 7B
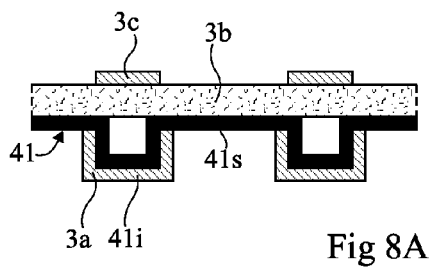 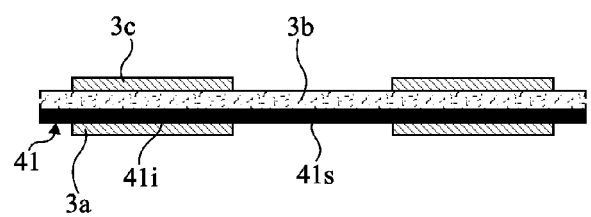
Fig 8A  Fig 8B
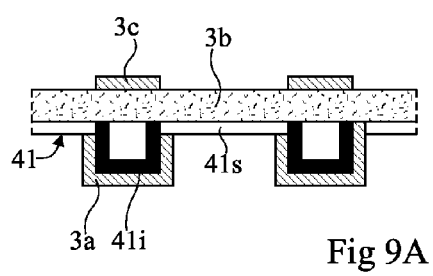 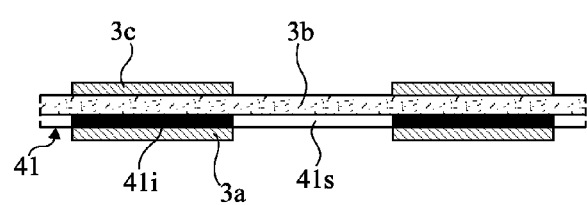
Fig 9A  Fig 9B

PRESSURE POWER RECOVERY DEVICE

BACKGROUND OF THE INVENTION

1. Field of the Invention

The present invention relates to a power recovery device capable of converting mechanical power of a pressure force exerted on an actuator into electric power.

2. Discussion of Prior Art

It has been provided to integrate power recovery devices in various objects capable of being submitted to a pressure exerted by a user, for example, a push-button switch, bathroom scales, a remote control, a bicycle pedal, etc.

Current pressure power recovery devices comprise an actuator capable of being displaced in translation under the effect of the pressure exerted by the used, and a piezoelectric or electromagnetic converter for transforming the mechanical power linked to the lateral motion of the actuator into electric power. It should be noted that "actuator" here designates an actuation member via which the mechanical force to be exploited is transmitted to the converter. However, such systems may generally also be used as electromagnetic converters. In this case, the device is supplied with electric power, and converts this power into mechanical power, thus causing the displacement of the actuator.

A disadvantage of such devices is the low efficiency of piezoelectric or electromagnetic converters used. As an example, when a 10-N force is exerted on a push-button capable of undergoing a 3-mm displacement, the amount of available mechanical power is 30 mJ. Current devices enable at best to provide from 0.2 to 0.5 mJ of useful electric power, that is, an efficiency lower than 2%.

Another disadvantage of such devices is the relatively large number of parts necessary to their manufacturing.

SUMMARY OF THE INVENTION

Thus, an object of an embodiment of the present invention is to provide a power recovery device overcoming all or part of the disadvantages of existing solutions.

An object of an embodiment of the present invention is to provide a power recovery device having a better efficiency than existing solutions.

An object of an embodiment of the present invention is to provide such a device capable of being easily integrated to any type of object capable of being submitted to an external pressure force.

An object of an embodiment of the present invention is to provide such a device which is easily adaptable to any type of convenience object.

An object of an embodiment of the present invention is to provide such a device which is easy to manufacture with few parts.

Thus, an embodiment of the present invention provides a power recovery device, comprising: an electroactive polymer membrane; an actuator capable of moving along a first direction non-parallel to the mid-plane of the membrane; a member for converting the motion of the actuator into a stretching of the membrane along at least one second direction of the mid-plane of the membrane; and means for biasing the membrane comprising an electret.

According to an embodiment, the conversion member further converts the motion of the actuator into a stretching of the membrane along at least one third direction of the mid-plane of the membrane.

According to an embodiment, this member comprises at least two first rigid arms, mobile in rotation around a first axis forming one block with the actuator and approximately orthogonal to the first and second directions, the first two arms being connected to the membrane respectively in two different points of the second direction.

According to an embodiment, the conversion member further comprises at least two second rigid arms, mobile in rotation around a second axis forming one block with the actuator and approximately orthogonal to the first and third directions, the first two arms being attached to the membrane respectively in two different points of the third direction.

According to an embodiment, the power recovery device further comprises means for returning to an idle position.

According to an embodiment, the electret is positioned under the membrane and forms a surface approximately coinciding, in top view, with the membrane, and having a corrugated relief in planes orthogonal to the membrane.

According to an embodiment, the electret is made of charged Teflon.

According to an embodiment, the electret is deposited on a support having a corrugated relief in planes orthogonal to the membrane.

According to an embodiment, the membrane comprises a stack of a first electrode, of an electroactive polymer film, and of a second electrode, the electret being arranged between the second electrode and said film.

Another embodiment provides a push-button switch integrating a power recovery device such as mentioned hereabove.

The foregoing and other objects, features, and advantages will be discussed in detail in the following non-limiting description of specific embodiments in connection with the accompanying drawings.

BRIEF DESCRIPTION OF THE DRAWINGS

FIGS. 6A and 6B are simplified cross-section views showing an embodiment of a power recovery device;

FIGS. 7A and 7B are partial simplified cross-section views showing an alternative embodiment of the device of FIGS. 6A and 6B;

FIGS. 8A and 8B are partial simplified cross-section views showing another alternative embodiment of the device of FIGS. 6A and 6B; and FIGS. 9A and 9B are partial simplified cross-section views showing another alternative embodiment of the device of FIGS. 6A and 6B.

DETAILED DESCRIPTION

Figures 1A, 1B:
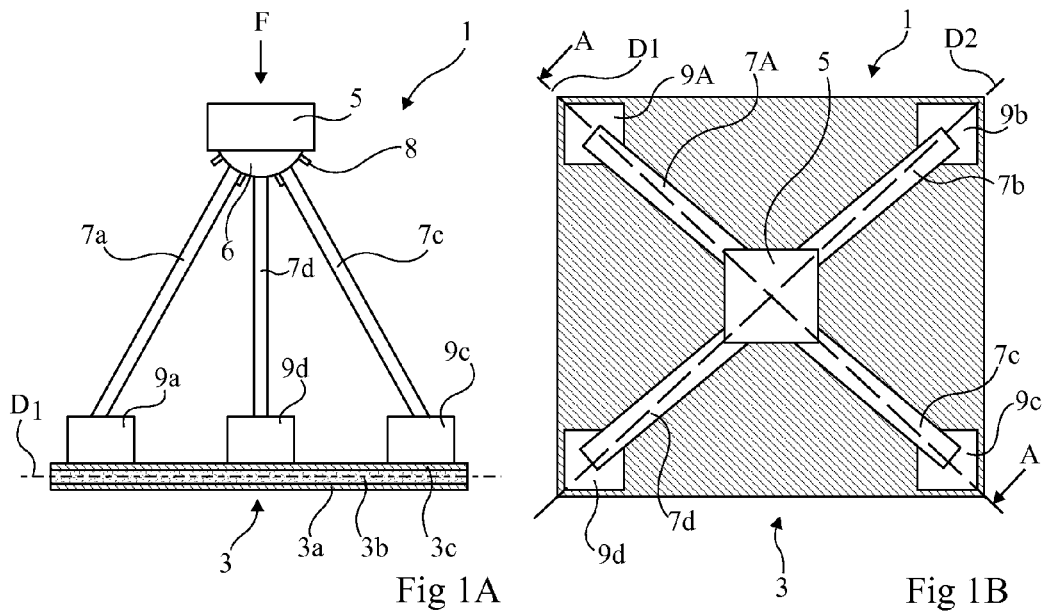
FIG. 1A is a cross-section view schematically and partially illustrating an embodiment of a pressure power recovery device.
FIG. 1B is a partial simplified view of the device of FIG. 1A.

For clarity, the same elements have been designated with the same reference numerals in the different drawings and, further, the various drawings are not to scale.

A power recovery device capable of converting a pressure into electric power by means of an electroactive polymer membrane is here provided.

Flexible deformable membranes using electroactive polymers, and more specifically dielectric polymers, capable of transforming a mechanical deformation to which they are submitted into electric power, are known. Typically, a polymer film forms the dielectric of a variable capacitive element and is sandwiched between two flexible electrodes.

In electromechanical converter mode, when a tension is applied to the structure thus formed (polymer+electrodes), the latter is stretched in the plane and contracts according to its thickness. In mechano-electrical converter mode, the conversion principle is an electrostatic principle, that is, a variation of the power stored within a variable capacitor along three directions (plane and thickness). Such a capacitance variation is induced by a mechanical motion (vibrations, forces . . . ). Dielectric polymers thus are passive materials requiring the performing of a power cycle to convert mechanical power into electricity. The polymer is deformed, and then charged. Initial electric power is stored in the capacitor formed by the dielectric polymer. Then, the polymer mechanically moves, the capacitance varies so that the stored electric power is amplified. This so-called active phase is generally performed at constant charge Q or at constant voltage V. Then, the electric power is removed from the polymer and the latter recovers its original dimensions.

The resulting electric power may be processed and shaped by an appropriate system to power a secondary device or to be stored. The electric charge and discharge cycles are synchronized by an adapted electric management circuit.

Examples of electroactive membranes of this type are described in French patent application 2936650. Such membranes have a mechano-electrical conversion efficiency much greater than the efficiency of usual piezoelectric or electromagnetic converters.

FIGS. 1A and 1B schematically and partially illustrate an embodiment of a power recovery device 1. FIG. 1B is a top view, and FIG. 1A is a cross-section view along line A-A of FIG. 1B.

Device 1 comprises an approximately planar electroactive membrane 3, formed of a stack of a first electrode 3a, of a dielectric polymer 3b, and of a second electrode 3c. In this example, membrane 3 has, in top view (FIG. 1B), an approximately square general shape. It should be noted that the membrane is not necessarily perfectly planar, but may be corrugated or have various reliefs extending on either side of a mid-plane.

In this example, device 1 further comprises, outside of the membrane plane and substantially in front of the central portion of the membrane, an actuator 5 capable of moving along an axis approximately orthogonal to the membrane. More generally, actuator 5 may be mobile along an axis intersecting the medium plan of the membrane, that is, an axis non parallel to the mid-plane of the membrane. In this example, actuator 5 is capable of being submitted to a pressure force F approximately orthogonal to the membrane plane, and to displace under the effect of this force. More generally, force F may be oblique with respect to the mid-plane of the membrane, and comprise a non-zero vertical component (orthogonal to the membrane plane).

Four rigid arms 7a to 7d connect actuator 5 to the four corners of membrane 3. Each arm 7 is attached by one end to a corner of the membrane by means of a fastening system 9 (respectively 9a to 9d). Fastening system 9 for example is a spot of glue, a welding, a stitch, a thrust bearing, or any other adapted system. In the shown example, fastening points 9a and 9c of arms 7a and 7c are arranged at the ends of a first diagonal D1 of the membrane, and fastening points 9b and 9d of arms 7b and 7d are arranged at the ends of second diagonal D2.

On the side of their end connected to membrane 3, arms 7a to 7d are connected to actuator 5, for example, via a ball joint 6 (FIG. 1A). Arms 7a and 7c are articulated with respect to each other and with respect to actuator 5 according to a degree of liberty in rotation around an axis (not shown) of the actuator parallel to the membrane plane and orthogonal to diagonal D1. Arms 7b and 7d are articulated with respect to each other and with respect to the actuator according to a degree of liberty in rotation around an axis (not shown) of the actuator parallel to the membrane plane and orthogonal to diagonal D2.

When a pressure F approximately orthogonal to the membrane plane is exerted on actuator 5, the resulting lateral motion of the actuator causes the opening of the angles formed between arms 7a and 7c on the one hand, and between arms 7b and 7d on the other hand. This results in a stretching of the membrane from its four corners, along diagonals D1 and D2.

To promote the membrane stretching, means, not shown, for maintaining the membrane in a fixed plane, may optionally be provided. It may for example be a support frame, deformable but more rigid than the membrane, inside or on top of which the membrane is stretched, and connected at its four corners to fasteners 9a to 9d. Stroke-end stops formed of pins 8 placed on ball joint 6 may be provided to limit the maximum stretching and the minimum stretching of the membrane. Any other system for limiting the membrane stretching may be provided.

According to an advantage of the power recovery system, pressure F exerted by the user results in stretching electroactive polymer membrane 3 along the two different directions corresponding to diagonals D1 and D2, which enables to maximize the amount of recovered power. Further, force F is amplified by the lever arm formed by arms 7a to 7d.

The present invention is however not limited to this specific configuration. In particular, it may be chosen to stretch the membrane in a single direction, by means of a mechanism with two arms, or along more than two directions, by means of a spider mechanism comprising two arms for each desired stretching direction. Further, the membrane may have any other shape than that shown in FIG. 1B, for example, a rectangular, octagonal, circular, triangular, or other shape. If the membrane is slightly corrugated and/or has reliefs around a mid-plane, during its stretching, it may also move in a substantially vertical plane.

More generally, a power recovery device comprising a planar electroactive polymer membrane, an actuator capable of moving along a direction orthogonal to the membrane plane, and a member for converting the actuator motion into a stretching of the membrane along one or several directions of its plane are provided herein.

Figure 2A:
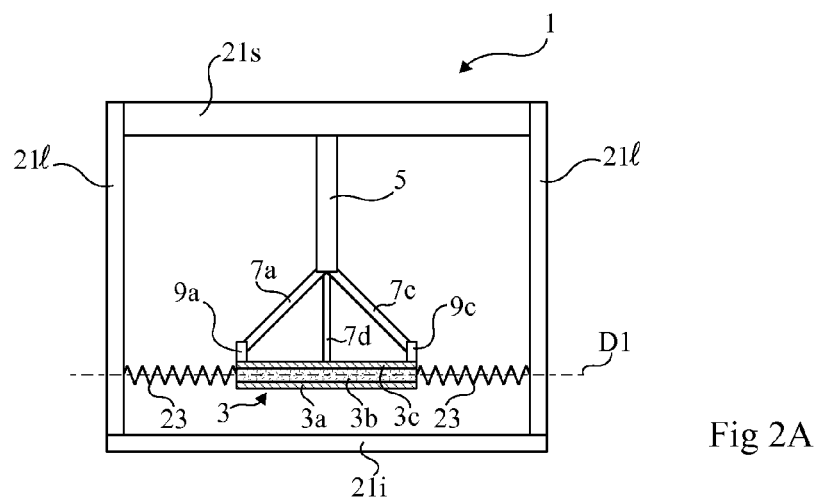
FIGS. 2A and 2B are cross-section views schematically illustrating the power recovery device of FIGS. 1A and 1B, respectively in first and second operating positions.
Figure 2B:
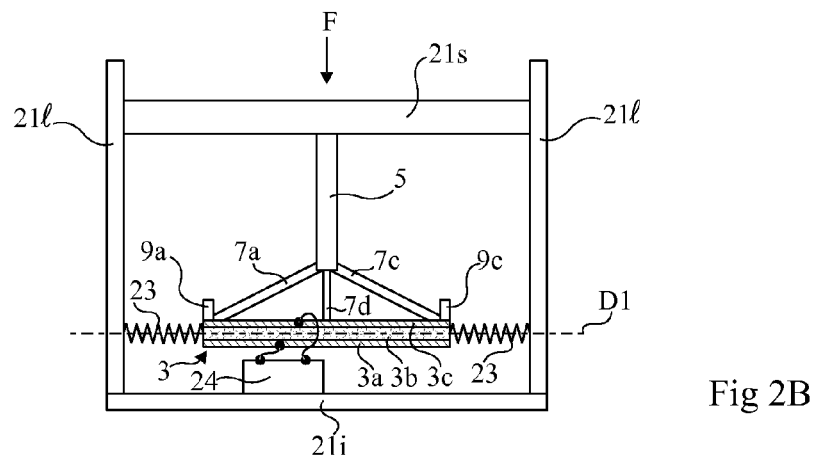

FIGS. 2A and 2B are cross-section views schematically illustrating power recovery device 1 of FIGS. 1A and 1B, respectively in first and second operating positions.

In this example, the system described in relation with FIGS. 1A and 1B is integrated in a package 21 of generally parallelepipedal shape. Membrane 3 is arranged in a horizontal plane parallel to opposite lower 21i and upper 21s walls of package 21. Support means, not shown, may be provided to maintain the membrane in this plane.

Orientation and positioning terms "lower", "upper", "lateral", "horizontal", and "vertical" are used herein and in the rest of the present description by arbitrarily referring to the orientation of FIGS. 2A and 2B. It should however be understood that the provided power recovery system is capable of operating whatever the orientation of package 21.

Actuator 5 and arms 7a to 7d are placed next to membrane 3 opposite to lower wall 21i, and actuator 5 is attached to upper wall 21s. Upper wall 21s is mobile in translation or deformable along a vertical direction, so that the application of a substantially vertical pressure F (FIG. 2B) on this wall (or of a non-vertical force having a non-zero vertical component) sets actuator 5 to motion. Thus, the application of a vertical pressure F on wall 21s results in stretching membrane 3 along its diagonals.

Return means are further provided to bring device 1 back to an idle position when pressure F stops being exerted. In this example, the return means are formed of springs 23 bearing between lateral surfaces 21l of package 21 and fastening points 9 of the membrane. Any other adapted return mechanism may be provided. As an example, a spring may be provided between arms 7a and 7c and/or between arms 7b and 7d (FIG. 1B). It should further be noted that, due to its resilience, the membrane naturally contributes to bringing device 1 back to an idle position. If this contribution is sufficient, complementary return means may be omitted.

Device 1 further comprises an electric management circuit 24 for applying a bias voltage between electrodes 3a and 3c when the membrane is stretched, and for recovering the charges generated by dielectric polymer 3b when the membrane shrinks. In an embodiment, a piezoelectric element may be associated with return means 23 to generate the required bias voltage. The piezoelectric element may even form the actual return means. A voltage level matching is then necessary, via a converter between the piezoelectric element and the electroactive membrane.

Figure 3:
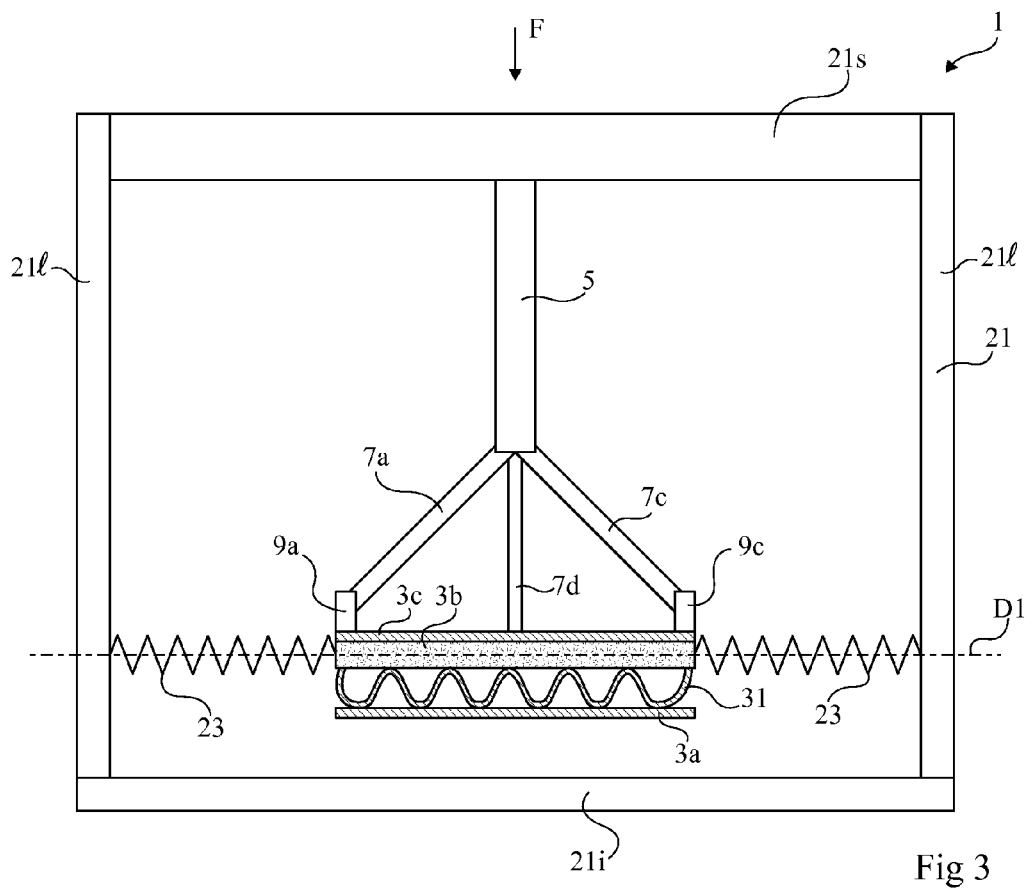
FIG. 3 is a cross-section view schematically illustrating another embodiment of a pressure power recovery device.

FIG. 3 is a cross-section view schematically illustrating a preferred embodiment of power recovery device 1 of FIGS. 2A and 2B. It is here provided to bias the membrane by means of an electret 31, that is, an element made of a dielectric material having a quasi-permanent electric biasing state. A charged Teflon electret may for example be used.

Electret 31 forms a surface approximately coinciding, in top view, with membrane 3, and having a corrugated relief, for example, in waves, triangles, or rectangles, in one or several planes orthogonal to the membrane. Such a serpentine shape enables the electret to deploy and to follow the membrane deformations. For a non-stretched membrane, the electret is corrugated and for a fully stretched membrane, the electret is for example planar and parallel to the membrane. Electret 31 is placed between dielectric layer 3b and electrode 3a. Electrode 3a may be planar, as shown in FIG. 3, or follow the shape of electret 31. Electret 31 is for example attached to layer 3b by spots of glue arranged in upper locations of the corrugated surface, or by any other known prior art fastening system. More generally, the electret shape and the means for fastening the electret under membrane 3 are selected so that the electret follows the membrane deformations.

In the idle state, the electret has a permanent charge Qi which induces the occurrence of charges on the two electrodes: an electrostatic equilibrium of the structure must be maintained. The capacitor formed by the dielectric is thus biased. When the electroactive membrane deforms, the value of the system capacitance changes. The charges present on the two electrodes reorganize to provide an electrostatic equilibrium. Such charge movements occur through a load (resistor ...). The voltage across this load forms the so-called recovered power. It should be noted that according to the direction of the mechanical motion of the electroactive membrane, the charges flow in one direction or in the other through the resistor (A.C. voltage). An advantage of this embodiment is that the electric management circuit used is much simpler than the circuit which would be used in a hybrid piezoelectric-based solution. The use of an electret enables to directly obtain a high bias voltage, without having to provide a complementary voltage converter. As an example, a charged Teflon electret provides a permanent surface voltage on the order of 300 V. Teflon further has the advantage of being sufficiently flexible to follow the membrane deformations.

It should be noted that any other adapted shape and/or arrangement of the electret may be envisaged.

Figure 4A:
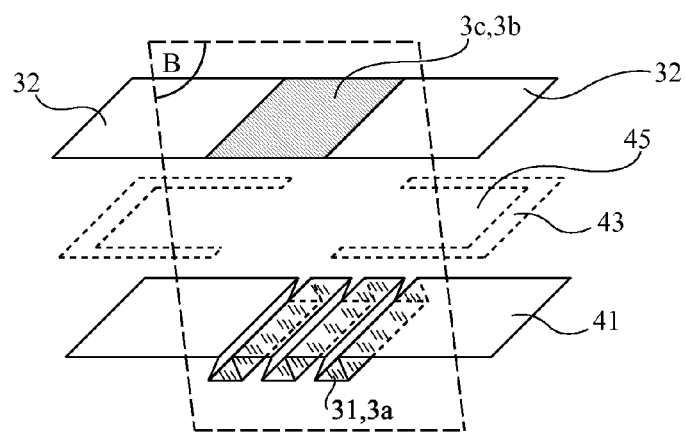
FIG. 4A is a perspective view schematically and partially showing an alternative embodiment of the power recovery device of FIG. 3.

FIG. 4A is a perspective view schematically and partially showing an alternative embodiment of the power recovery device of FIG. 3.

Figure 4B:
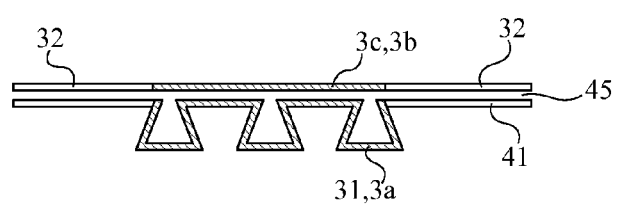
FIG. 4B is a partial simplified cross-section view of the device of FIG. 4A.

FIG. 4B is a partial cross-section view of the device of FIG. 4A along plane B of FIG. 4A.

In this example, the membrane formed by the stacking of electrode 3c and of polymer 3b is rectangular and is surrounded with inactive portions 32 having the function of maximizing the mechanical deformations of the membrane. The membrane is only likely to be deformed in one direction. The mechanism of conversion of the pressure motion exerted by the user into a membrane stretching motion for example is a mechanism with two arms.

A support 41 is provided to ensure the surface evenness of the membrane and to avoid an excessive stretching that may result in a rupture thereof. Support 41 forms (in top view) an approximately rectangular surface having dimensions at least equal to those of the membrane and of active portions 32, and has a serpentine relief in planes orthogonal to the membrane and parallel to its stretching direction (FIG. 4B).

It is here provided to form support 41 of a material of quasi-permanent electric biasing such as charged Teflon, so that this support directly ensures the membrane biasing. It should be noted that the region(s) of support 41 in front of membrane 3c, 3b form an electret. Such regions are here formed by the stacking of actual electret 31 and of lower electrode 3a of the membrane. It may also be provided to form a support 41 in one block and to only locally charge these regions so that they ensure their electret function. A support 41 formed of several parts of different materials may also be provided, the support portion(s) in front of membrane 3c, 3b for example being formed of charged Teflon. As a variation, a support 41 of any material, for example, selected for its rigidity and resilience, may also be provided, and parts of this support may be coated with a material having a quasi-permanent electric biasing (electret). A peripheral shim 43 (FIG. 4A) is provided between inactive portions 32 of membrane 3b, 3c and electret/support 41, so that an air area 45 separates the membrane from the support. This enables the membrane to be free to uniformly stretch or shrink over its entire surface, whatever the support geometry.

Figure 5:
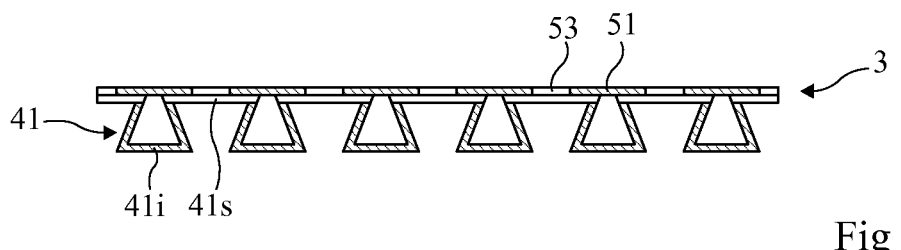
FIG. 5 is a cross-section view schematically and partially showing an alternative embodiment of the power recovery device of FIGS. 4A and 4B.

FIG. 5 is a cross-section view in the same plane as FIG. 4B, schematically and partially showing an alternative embodiment of the power recovery device of FIGS. 4A and 4B.

In this example, no shim is provided between support 41 and the membrane. Thus, an upper portion 41s of support 41 (corresponding to the upper sections of the serpentine) is in direct contact with the membrane. Unlike the device shown in FIGS. 4A and 4B, upper portion 41s is not electrically charged. Conversely, lower portion 41i of support 41 (corresponding to the lateral and lower sections of the serpentine of FIG. 5) forms a charged electret. Lower portions 41i are actually formed by the stacking of electret 31 and of electrode 3a (FIG. 3).

Membrane 3 is formed of an alternation of electroactive strips 51 and of juxtaposed inactive areas 53. Electroactive strips 51 are formed by the stacking of upper electrode 3c and of dielectric polymer 3b (see FIG. 3), and are arranged in front of the electret located at the level of lower regions 41i of support 41. Inactive strips 53 are for example formed by upper electrode 3c, and comprise no electroactive polymer. Thus, the structure is formed of a plurality of juxtaposed electroactive generators.

FIGS. 6A and 6B are simplified cross-section views showing an embodiment of a power recovery device. FIGS. 6A and 6B more specifically show an example of arrangement of an electroactive membrane and of an electret for biasing this membrane in a power recovery device. FIGS. 6A and 6B show the membrane respectively in an idle position and in a stretched position.

As in the example of FIG. 5, a support 41 having a serpentine surface (or any other corrugated relief) is provided to ensure the surface evenness of the membrane and to avoid an excessive stretching that may result in a rupture thereof. The membrane comprises a continuous polymer film 3b, extending above support 41. Some portions only of film 3b in front of lower portions 41i of the serpentine are active, that is, sandwiched between electrodes 3c and 3a.

In this example, support 41 is made of any material, selected for its rigidity/resilience. Lower portions 41i of the support (portions of the serpentine which are not attached to the membrane) provide a degree of liberty enabling a stretching of the membrane. Upper portions 41s of the support (areas of attachment of the support to the membrane) are attached to polymer film 3b. Portions 41i, which are not attached to the membrane, and portions 41s, attached to the membrane, cooperate to behave as limiters of the membrane stretching.

On the side of polymer film 3b, portions 41i of support 41 are coated with an electrode 3a, itself coated with an electret 3d, for example, made of charged Teflon, Parylene, or other. On the side opposite to support 41, an electrode 3a coats the polymer film in front of portions 41i. The electrodes are for example made of gold, silver, aluminum, etc. They may be deposited by lithography, evaporation, gluing, or other techniques. The electret may be charged after its deposition, for example, by corona discharge.

It should be noted that electroactive polymer 3b and electrodes 3a and 3c may be very flexible (Young's modulus on the order of $10^6$ Pa), and may undergo significant deformations (on the order of from 10% to 100%). Electret 3d is generally more rigid (Young's modulus on the order of $10^9$ Pa). An advantage of providing a corrugated support is that it enables to keep significant deformation possibilities despite the relative rigidity of the electret (which would for example not be possible by gluing a planar electret directly against the membrane).

FIGS. 7A and 7B are partial simplified cross-section views showing an alternative embodiment of the device of FIGS. 6A and 6B. FIG. 7A shows the membrane in an idle position, and FIG. 7B shows the membrane in a stretched position.

The device of FIGS. 7A and 7B comprises the same elements as the device of FIGS. 6A and 6B and differs from this device only by the shape of the corrugations of support 41 (and accordingly the shape of electrodes 3a and of electret 3d). In the embodiment of FIGS. 6A and 6B, portions 41i of support 41 have a substantially triangular shape. In the embodiment of FIGS. 7A and 7B, portions 41i of the support have a substantially rectangular shape (crenellated support).

FIGS. 8A and 8B are partial simplified cross-section views showing another alternative embodiment of the device of FIGS. 6A and 6B. FIG. 8A shows the membrane in an idle position, and FIG. 8B shows the membrane in a stretched position.

As compared with FIGS. 6A, 6B and 7A, 7B, a difference is that support 41 directly behaves as an electret, that is, it is made of a dielectric material having a quasi-permanent electric biasing state. Electrodes 3a (in front of portions 41i of the support) are then formed on the support side opposite to polymer film 3b, to keep an electrode (3a)—polymer (3b)—electret (41)—electrode (3c) stack.

FIGS. 9A and 9B are partial simplified cross-section views showing another alternative embodiment of the device of FIGS. 6A and 6B. FIG. 9A shows the membrane in an idle position, and FIG. 9B shows the membrane in a stretched position.

The device of FIGS. 9A and 9B differs from the device of FIGS. 8A and 8B in that the support is formed of several parts made of different materials. In this example, portions 41i of the support are made of an electret material, for example, charged Teflon, and portions 41s are made of another material.

It should be noted that any shape and/or arrangement of the electret, other than those described in relation with FIGS. 6 to 9 may be used, and in particular the shapes favorable to a stretching of the electroactive membrane along two different directions of the membrane plane.

Specific embodiments of the present invention have been described. Various alterations, modifications and improvements will readily occur to those skilled in the art.

In particular, various examples of use of a pressure power recovery device have been mentioned hereabove. The present invention is not limited to these examples. The provided device may be used in any type of object capable of being submitted to a pressure from a user or from an external element. This device may for example be used in floor tiles, in a bicycle saddle, in a chair leg frame.

Further, it will be within the abilities of those skilled in the art to adapt the provided power recovery device to exploit not only a direct pressure exerted on an actuator, but also other types of forces, for example, a force exerted via a rotating element such as a door knob or a lock, which will set to motion the membrane stretching arms.

Further, FIGS. 1A to 3 show power recovery systems in which actuator 5 is arranged substantially in front of the central portion of the membrane. Of course, the present invention is not limited to this specific case. An actuator 5 off-centered with respect to the membrane may for example be provided, and stretching arms of different lengths connected to the ends of the membrane may be used.

Further, the use of charged Teflon to form an electret for biasing the electroactive membrane has been mentioned hereabove. Any other adapted electret material may be used.

Power recovery devices comprising an electroactive membrane formed of a dielectric polymer sandwiched between two electrodes have been described and shown. It should be noted that the electroactive membrane may be formed of an alternated stack of several dielectric polymer layers and of electrodes.

The present inventors have observed that by using a membrane formed of an alternated stack of from 5 to 10 dielectric polymer layers and of electrode layers, the provided device enables to recover between 2 and 10 mJ of useful electric power in a push-button switch receiving a 30-mJ mechanical power from a user.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A power recovery device comprising:
an electroactive polymer membrane;
an actuator capable of moving along a first direction non-parallel to the mid-plane of the membrane;
a member for converting the motion of the actuator into a stretching of the membrane along at least one second direction of the mid-plane of the membrane;
means for biasing the membrane comprising an electret; and
means for returning to an idle position.

2. The device of claim 1, wherein said member further converts the motion of the actuator into a stretching of the membrane along at least one third direction of the mid-plane of the membrane.

3. The device of claim 1, wherein said member comprises at least two first rigid arms, mobile in rotation around a first axis forming one block with the actuator and approximately orthogonal to the first and second directions, the first two arms being connected to the membrane respectively in two different points of the second direction.

4. The device of claim 2, wherein said member comprises at least two second rigid arms, mobile in rotation around a second axis solid with the actuator and approximately orthogonal to the first and third directions, the first two arms being connected to the membrane respectively in two different points of the third direction.

5. The device of claim 1, wherein the electret is positioned under the membrane and forms a surface approximately coinciding, in top view, with the membrane, and having a corrugated relief in planes orthogonal to the membrane.

6. The device of claim 1, wherein the electret is made of charged Teflon.

7. The device of claim 1, wherein the electret is deposited on a support having a corrugated relief in planes orthogonal to the membrane.

8. The device of claim 1, wherein the membrane comprises a stack of a first electrode, of an electroactive polymer film, and of a second electrode, the electret being arranged between the second electrode and said film.

9. A push-button switch comprising the device of claim 1.

* * * * *